(12) United States Patent
Kang

(10) Patent No.: US 7,595,511 B2
(45) Date of Patent: Sep. 29, 2009

(54) NITRIDE MICRO LIGHT EMITTING DIODE WITH HIGH BRIGHTNESS AND METHOD OF MANUFACTURING THE SAME

(75) Inventor: Sang-Kyu Kang, 208-302 Moklyun Apt. 1052, Hogae-dong, Dongan ku, Anyang City, Geonggi-do (KR) 431-080

(73) Assignee: Sang-Kyu Kang, Seoul (KR)

( * ) Notice: Subject to any disclaimer, the term of this patent is extended or adjusted under 35 U.S.C. 154(b) by 364 days.

(21) Appl. No.: 10/567,482

(22) PCT Filed: Aug. 8, 2003

(86) PCT No.: PCT/KR03/01600

§ 371 (c)(1),
(2), (4) Date: Feb. 6, 2006

(87) PCT Pub. No.: WO2005/015647

PCT Pub. Date: Feb. 17, 2005

(65) Prior Publication Data

US 2006/0208273 A1 Sep. 21, 2006

(51) Int. Cl.
*H01L 33/00* (2006.01)
*H01L 29/18* (2006.01)
(52) U.S. Cl. .......................................... 257/88; 257/79
(58) Field of Classification Search .................. 257/79, 257/85, 90, 94, 103
See application file for complete search history.

(56) References Cited

U.S. PATENT DOCUMENTS 5,779,924 A * 7/1998 Krames et al. ................ 216/24

2004/0206962 A1* 10/2004 Erchak et al. ................ 257/79

FOREIGN PATENT DOCUMENTS

| JP | 10-294533 A | 11/1998 |
| JP | 2001-24222 A | 1/2001 |
| JP | 2001-308380 A | 11/2001 |
| KR | 2004-8962 A | 1/2004 |

OTHER PUBLICATIONS

International Search Report (Form PCT/ISA/210).

* cited by examiner

*Primary Examiner*—Kenneth A Parker
*Assistant Examiner*—Anthony Ho
(74) *Attorney, Agent, or Firm*—Intellectual Property Law Group LLP; Juneko Jackson; Otto O. Lee

(57) ABSTRACT

The present invention relates to a nitride micro light emitting diode (LED) with high brightness and a method of manufacturing the same. The present invention provides a nitride micro LED with high brightness and a method of manufacturing the same, wherein a plurality of micro-sized luminous pillars 10 are formed in a substrates, a gap filling material such as $SiO_2$, $Si_3N_4$, DBR($ZrO_2/SiO_2$ $HfO_2/SiO_2$), polyamide or the like is filled in gaps between the micro-sized luminous pillars, a top surface 11 of the luminous pillar array and the gap filling material is planarized through a CMP processing, and then a transparent electrode 6 having a large area is formed thereon, so that all the luminous pillars can be driven at the same time. In addition, the present invention provides a nitride micro LED with high brightness in which uniformity in formation of electrodes on the micro-sized luminous pillars array is enhanced by employing a flip-chip structure.

3 Claims, 7 Drawing Sheets

NITRIDE MICRO LIGHT EMITTING DIODE WITH HIGH BRIGHTNESS AND METHOD OF MANUFACTURING THE SAME

FIELD OF THE INVENTION

The present invention relates to a nitride micro light emitting diode (LED) with high brightness and a method of manufacturing the same, and specifically to a nitride micro light emitting diode (LED) with high brightness and a method of manufacturing the same, in which luminous efficiency is maximized by finely adjusting micro-sized nitride luminous elements and allowing an array of the elements to be driven at the same time.

BACKGROUND OF THE INVENTION

In recent, because of excellent characteristics of a gallium nitride (GaN) semiconductor, a nitride semiconductor LED is widely studied.

Specifically, in order to use the nitride LED for illumination as well as for display, the brightness limit of the commercialized LED should be overcome.

The nitride LED generally emits light in an element area having a diameter of 300 μm or more. The light emitted from a luminous layer may not get out of the element and be locked in the element, so that the nitride LED has a limit that its external luminous efficiency does not exceed 30%.

In order to solve this problem, the internal luminous efficiency and the external luminous efficiency should be optimized, respectively. Since most GaN is grown using a heterogeneous epitaxy technology, a plurality of lattice defects necessarily exist therein, thereby resulting in deterioration of the internal luminous efficiency.

Nonetheless, the recent GaN growth technologies have a tendency to be based on the heterogeneous epitaxy technology, and thus it is difficult to expect enhancement of the internal luminous efficiency any more. Therefore, trials for enhancing the luminous efficiency through technologies such as efficient formation of electrodes and packaging technologies of enhancing concentration of light with an element structure previously optimized and grown into a thin film have been issued.

BRIEF DESCRIPTION OF THE ACCOMPANYING DRAWING

DETAILED DESCRIPTION OF THE INVENTION

Technical Theme

Figure 1:
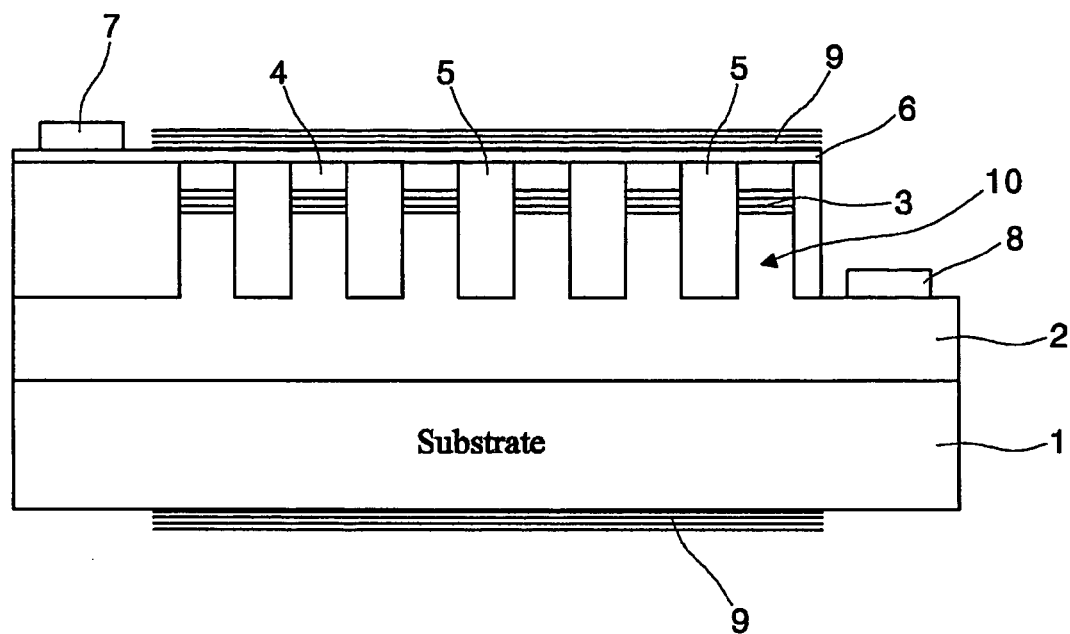
FIG. 1 is a view illustrating a micro light emitting diode (LED) according to one embodiment of the present invention.

In order to solve the above problems, the present invention is contrived to provided a nitride micro LED with high brightness improved using a nitride semiconductor having a previously-optimized and grown-into-thin-film structure. Therefore, it is an object of the present invention to provide a nitride micro LED with high brightness and a method of manufacturing the same, in which a luminous area is increased as large as possible to allow light emitted from an active layer to get out of an element, by controlling luminous elements in a micro size.

It is another object of the present invention to provide a nitride micro LED with high brightness which consumes the same power as the conventional large-area LED and of which the luminous efficiency is more excellent, and a method for manufacturing the same.

Technical Solution

In order to accomplish the above objects, according to one preferred embodiment of the present invention, a nitride micro LED with high brightness consuming the same power as the conventional large area LED but having more excellent luminous efficiency, and a method of manufacturing the same.

In order to accomplish the aforementioned objects, the present invention provides a nitride micro LED (Light Emitting Diode) with high brightness having a plurality of luminous pillars, the LED comprising: a plurality of micro-sized luminous pillars having an n-type GaN layer formed on a substrate, an active layer formed on the n-type GaN layer, and a p-type GaN layer formed on the active layer; a gap filling material filled between the luminous pillars to have substantially the same height as the luminous pillars; a p-type transparent electrode formed on a top surface of the gap filling material and the luminous pillars; a p-type electrode formed on the p-type transparent electrode; and an n-type electrode electrically connected to the n-type GaN layer, wherein an array of the luminous pillars is driven at the same time.

In the present invention, it is preferable that the gap filling material includes at least one selected from $SiO_2$, $Si_3N_4$ or a combination thereof, polyamide, and $ZrO_2/SiO_2$ or $HfO_2/SiO_2$.

In the present invention, the gap filling material is formed to have substantially the same height as the luminous pillars through a CMP (Chemical Mechanical Polishing) process.

In the present invention, a top surface of the p-type GaN layer of the luminous pillars may have convex surfaces formed through the CMP process. In this case, the convex surfaces serve as lenses.

In the present invention, it is preferable that the transparent electrode comprises a combination of oxidized Ni/Au(NiO/Au) or an ITO (Indium Tin Oxide).

In the present invention, it is preferable that the nitride micro LED further comprises a pair of DBR (Distributed Bragg Reflectors) layers formed on a top surface of the transparent electrode and a bottom surface of the substrate, respectively.

In the present invention, the nitride micro LED may further comprise an AR (Anti-reflection) layer coated on a top surface of the transparent electrode or a bottom surface of the substrate.

In the present invention, the luminous pillars may have side surfaces formed obliquely. In this case, it is preferable that the nitride micro LED further comprises a DBR layer made of $ZrO_2/SiO_2$ or $HfO_2/SiO_2$ and formed below the gap filling material within gaps between the luminous pillars.

Furthermore, the present invention provides a nitride micro LED with high brightness which is mounted through a flip-chip method, the nitride micro LED comprising: a sapphire substrate; a plurality of micro-sized luminous pillars having an n-type GaN layer grown on the sapphire substrate, an active layer formed on the n-type GaN layer and a p-type GaN layer formed on the active layer; a gap filling material filled between the luminous pillars to have substantially the same height as the luminous pillars; a metal electrode formed on a top surface of the gap filling material and the luminous pillars; a p-type electrode formed on the metal electrode; and an n-type electrode electrically connected to the n-type GaN layer, wherein an array of the luminous pillars is driven at the same time.

Furthermore, the present invention provides a method of manufacturing a nitride micro LED with high brightness having a plurality of micro luminous pillars, the method comprising: (a) a step of sequentially growing an n-type GaN layer, an active layer, and a p-type GaN layer on a wafer or substrate; (b) a step of dry-etching the processed wafer to form the luminous pillars having the n-type GaN layer, the active layer and the p-type GaN layer on the substrate; (c) a step of depositing a gap filling material in gaps between the luminous pillars; (d) a step of planarizing a top surface of an array of luminous pillars and a top surface of the gap filling material using a CMP process; and (e) a step of depositing a transparent electrode on all of the top surfaces of the array of luminous pillars and the gap filling material, depositing a p-type electrode and an n-type electrode at predetermined positions, respectively, and heating the resultant structure.

In the present invention, it is preferable that the step (c) is carried out such that the gaps between the luminous pillars are completely filled with the gap filling material, and the step (d) is carried out such that the top surface of the luminous pillars and the top surface of the gap filling material have the same height as each other.

In the present invention, the step (c) may be carried out such that the gaps between the luminous pillars are completely filled with the gap filling material, and the step (d) may be carried out such that the top surface of the p-type GaN layer in the luminous pillars is formed to have convex surfaces.

In the present invention, it is preferable that the gap filling material includes at least one selected from $SiO_2$, $Si_3N_4$ or a combination thereof, polyamide, and $ZrO_2/SiO_2$ or $HfO_2/SiO_2$.

In the present invention, it is preferable that the transparent electrode comprises a combination of oxidized Ni/Au(NiO/Au) or an ITO (Indium Tin Oxide).

In the present invention, it is preferable that the method further comprises, after the step (e), a step of depositing a pair of DBR (Distributed Bragg Reflectors) layers on a top surface of the transparent electrode and a bottom surface of the substrate.

In the present invention, it is preferable that the method further comprises, after the step (e), a step of coating an AR (Anti-reflection) layer on a top surface of the transparent electrode or a bottom surface of the substrate.

In the present invention, in the step (b), process variables may be controlled such that side surfaces of the luminous pillars are formed into oblique portions. In this case, it is preferable that the method further comprises, between the step (b) and the step (c), a step of depositing a DBR layer within the gaps between the luminous pillars.

Furthermore, the present invention provides a method of manufacturing a nitride micro LED with high brightness having a plurality of micro luminous pillars, the method comprising: (a) a step of sequentially growing an n-type GaN layer, an active layer and a p-type GaN layer on a sapphire wafer or substrate; (b) a step of dry-etching the processed wafer to form the luminous pillars having the n-type GaN layer, the active layer and the p-type GaN layer on the substrate; (c) a step of depositing a gap filling material in gaps between the luminous pillars; (d) a step of planarizing a top surface of an array of luminous pillars and a top surface of the gap filling material using a CMP process; and (e) a step of depositing a metal electrode on the overall top surface of the array of luminous pillars, depositing a p-type electrode and an n-type electrode thereon, respectively, and heating the resultant structure.

Furthermore, the present invention provides a method of manufacturing a nitride micro LED with high brightness having a plurality of micro luminous pillars, the method comprising: (a) a step of growing an n-type GaN buffer layer on a wafer or substrate; (b) a step of depositing an oxide film on the n-type GaN buffer layer; (c) a step of wet-etching and patterning the oxide film such that the oxide film has the plurality of pillars and gaps therebetween; (d) a step of sequentially re-growing an n-type GaN layer, an active layer and a p-type GaN layer up to a height of the oxide film pillars using the n-type GaN buffer layer exposed in a bottom surface of the gaps; and (e) a step of depositing a transparent electrode on the overall top surface of the array of luminous pillars re-grown, depositing a p-type electrode at a predetermined position, depositing an n-type electrode on the n-type GaN layer, and heating the resultant structure.

In the present invention, it is preferable that the method further comprises, after the step (e), a step of depositing a pair of DBR (Distributed Bragg Reflectors) layers on a top surface of the transparent electrode and a bottom surface of the substrate.

In the present invention, the method may further comprises, after the step (e), a step of coating an AR (Anti-reflection) layer on a top surface of the transparent electrode or a bottom surface of the substrate.

Peculiar Effect

According to the present invention as described above, by filling gaps between the luminous pillars in the nitride micro luminous pillar array with the gap filling material, planarizing the resultant structure using the CMP process, and forming the transparent electrode on the surface thereof, it is possible to maximize the luminous area and thus to externally use the light emitted from the active layer with a high efficiency.

In addition, it is possible to provide the nitride micro LED with high brightness, which consumes the same power as the conventional large-area LED and of which the luminous efficiency is more excellent.

Further, according to the present invention, by using the nitride micro LED with high brightness having an improved structure, it is expected to promote demands of LEDs for display and illumination. Furthermore, the present invention can apply to a method of manufacturing a micro LED for micro display.

Although the present invention has been described in connection with the preferred embodiments with reference to the accompanying drawings, the preferred embodiments are intended not to limit the invention but to exemplify best modes of the present invention. It will be understood by those skilled in the art that various changes or modifications may be made thereto without departing from the spirit and scope of the invention. Therefore, the present invention is defined only by the appended claims which should be construed as covering such changes or modifications.

BEST MODE FOR CARRYING OUT THE INVENTION

Now, preferred embodiments of the present invention will be described in detail with reference to the appended drawings.

First Embodiment

FIG. 1 is a view illustrating a micro LED according to one embodiment of the present invention, and FIGS. 2A to 2E are views illustrating a method of manufacturing the micro LED shown in FIG. 1.

As shown in FIG. 1, a nitride micro LED with high brightness according to the present invention comprises a substrate 1, a n-type GaN layer 2, an active layer 3, a p-type GaN layer 4, a gap filling material 5, a transparent electrode 6, a p-type electrode 7, an n-type electrode, and a DBR (Distributed Bragg Reflectors) layer 9. The reference numeral 10 in FIG. 1 denotes micro-sized luminous pillars.

Specifically, the n-type GaN layer 2, the InGaN/GaN active layer 3, the p-type GaN layer 4 sequentially grown and disposed on the sapphire ($Al_2O_3$) substrate 1 grown in a predetermined direction constitutes a plurality of micro-sized luminous pillars or luminous element pillars 10.

The luminous element pillars 10 are formed to be a circular cylinder shape in order to maximize the area for emitting light. Of course, the luminous element pillars 10 of the present invention may be formed to be a polygonal pillar shape other than the circular cylinder shape. Further, the diameter of the luminous element pillars 10 can be adjusted from 0.5 μm close to the wavelength of emitted light to several tens μm. Furthermore, the height of the pillars 10 can be adjusted such that the active layer, the n-type doped layer and the p-type doped layer all are included in the pillars. Such elements are formed using a dry etching method or a selective re-growth method. In this embodiment, a manufacturing method using the dry etching method will be first described, and then a manufacturing method using the selective re-growth method will be described in detail in an embodiment with reference to FIGS. 6A to 6D.

The gap filling material 5 is a material for filling in the gaps formed between the luminous element pillars 10, and facilitates the formation of electrodes of the respective pillars 10 through the planarization process. Materials usable for the gap filling material include $SiO_2$, $Si_3N_4$, a combination of $SiO_2$ and $Si_3N_4$, polyamide, $ZrO_2/SiO_2$, $HfO_2/SiO_2$ and so on. The method such as plasma enhanced chemical vapor deposition (PECVD), evaporation and sputtering is used for depositing the gap filling material.

A combination of oxidized Ni/Au(NiO/Au) or ITO (Indium Tin Oxide) is used for the transparent electrode 6. The transparent electrode 6 is formed on a surface of the upper p-type GaN layer 4 of the luminous element pillars 10 and a top surface 11 of the gap filling material 5 to drive all the pillars 10 at the same time with the electrical pumping of the respective luminous element pillars 10. Here, the surface of the upper p-type GaN layer 4 of the luminous element pillars 10 and the top surface 11 of the gap filling material 5 should be planarized through a predetermined process in advance.

The p-type electrode 7 and the n-type electrode 8 are made of at least one conductive material selected from gold (Au), aluminum (Al), copper (Cu) or alloys thereof.

The DBR layer 9 is formed on the transparent electrode 6 and a back surface of the substrate 1 as a layer having a high reflectivity for formation of the micro LED having a resonant cavity.

Like above, the micro-sized nitride luminous element of the present invention basically comprises the micro-sized luminous pillars, the gap filling material to be filled in the gaps between the pillars, DBR layers for formation of the resonant cavity LED (RCLED), and electrodes for the electrical pumping.

In other words, a point most different from the commercialized large-area LED is that the area for emitting light is enhanced by means of an array of micro-sized luminous elements in place of the large area as a plane. Further, in order to allow the luminous element array to be driven at the same time, a material such as silica is filled between the pillars, a structure having the transparent electrode is efficiently formed through a planarization process.

More specifically, a method of manufacturing the nitride micro LED will be described with reference to FIGS. 2A to 2E.

Figure 2A:
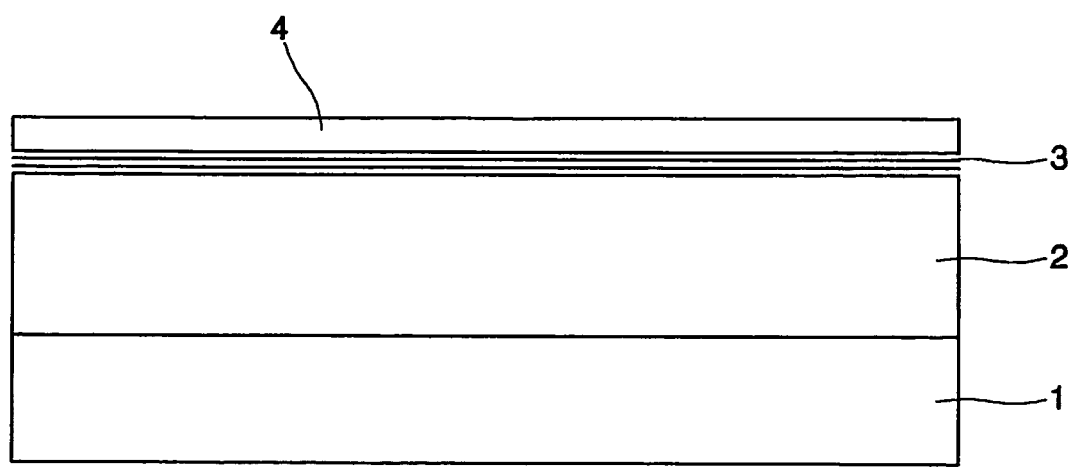
FIGS. 2A to 2E are views illustrating a method of manufacturing the micro LED shown in FIG. 1.

First, as shown in FIG. 2A, a luminous layer excellent in an internal luminous efficiency is grown using a metal organic chemical vapor deposition (MOCVD) method. That is, the n-type GaN layer 2 is formed on a sapphire wafer or substrate 1 having a predetermined crystal direction, the InGaN/GaN quantum well (QW) active layer 3 is formed thereon, and then the p-type GaN layer 4 is formed thereon.

Figure 2B:
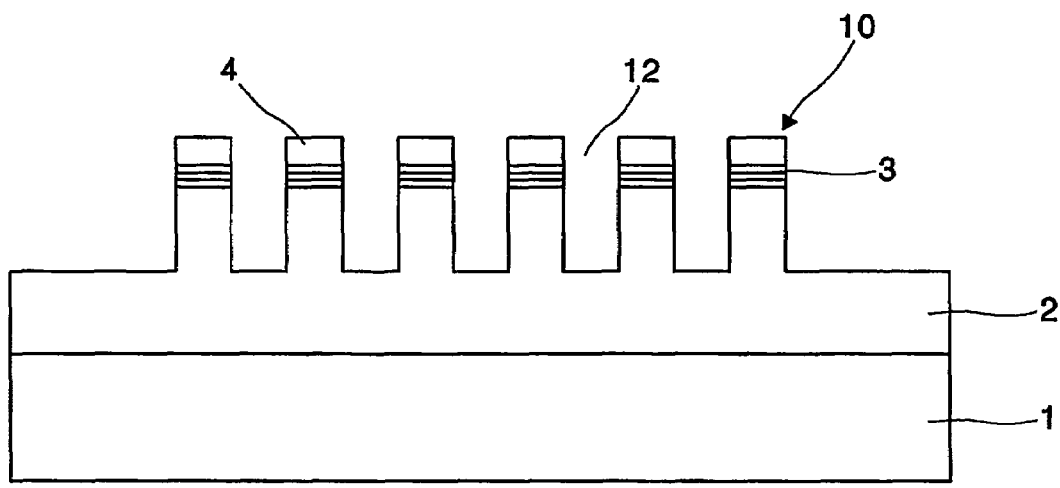

Next, the wafer on which the semiconductor luminous element structure is formed like above is dry-etched into pillar shapes as shown in FIG. 2B. This etching is carried out by means of an ICP (Inductive Coupled Plasma) process using a reactive gas such as $Cl_2$, $BCl_2$ or the like. As a shape of the luminous pillars 10, a polygonal shape may be selected in addition to a circular shape expected to be excellent in the luminous efficiency.

At that time, the height of the luminous pillars 10 is about 1 μm more or less such that the QW structure, the n-type GaN layer and the p-type GaN layer are all included in the pillars, and the diameter of the luminous pillars 10 is about 0.4 μm to several tens μm for forming photonic crystals.

Figure 2C:
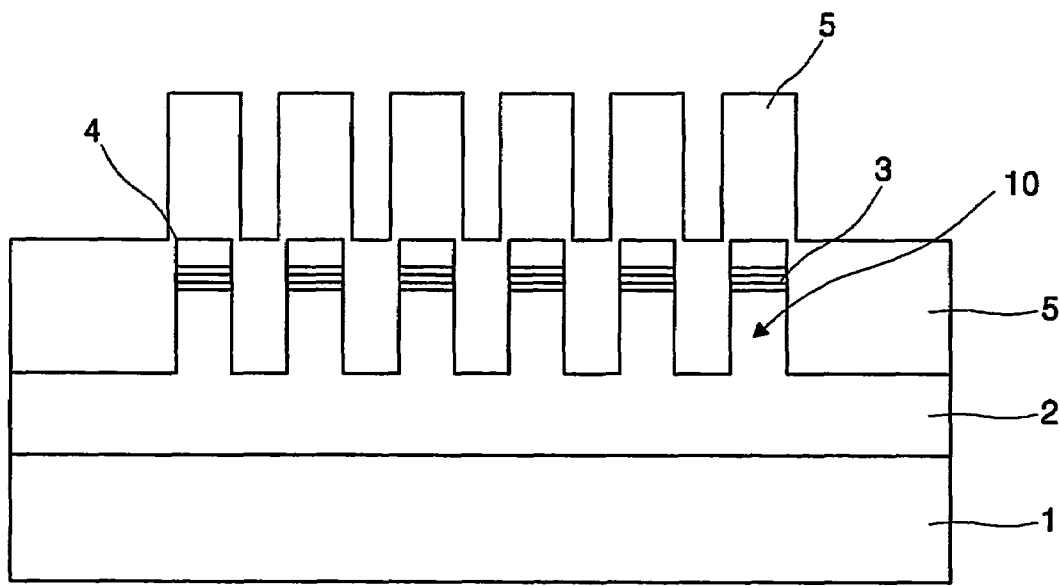

After the etching process, the gap filling material 5 is deposited in the gaps 12 between the luminous pillars 10. At that time, the filling material 5 is generally deposited in the same shape as shown in FIG. 2C. Therefore, the first deposition thickness of the gap filling material 5 should be at least the height of the luminous pillars 10 or more, and an accurate process selection and an accurate process control are required not to finally form voids in the gap filling layer due to deposition of the gap filling material. In order to satisfy such requirements, it is preferable that the process of depositing the gap filling material 5 employs a high-density plasma enhanced deposition method. In addition, as the gap filling material 5, $SiO_2$, $Si_3N_4$, a combination of $SiO_2$ and $Si_3N_4$, polyamide, $ZrO_2/SiO_2$, $HfO_2/SiO_2$ and so on can be used.

The raw materials of the gap filling material 5 can surely provide insulation between the respective luminous pillars 10 and can be thermally stable for the heat treatment in later processes, and in addition the refraction index thereof is higher than that of air to decrease a fresnel loss of the emitted light. Specifically, when $ZrO_2$ or $HfO_2$/is used for the first layer on side surfaces of the GaN layer, compared with a case of using only SiO2, difference in refraction index from the GaN is further decreased, thereby further decreasing the total reflection and the fresnel loss.

Figure 2D:
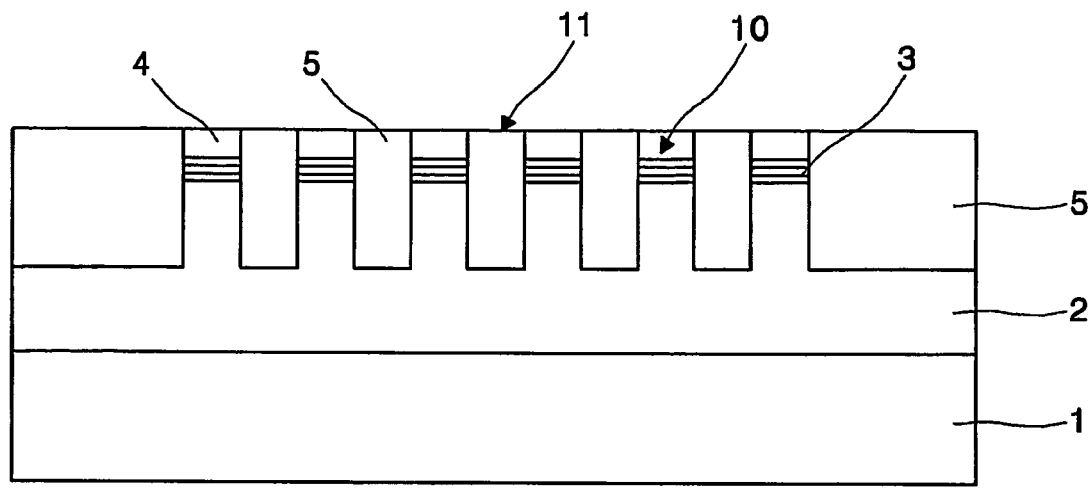

As shown in FIG. 2D, the deposited gap filling material 5 is subjected to a planarization process for providing the uniform transparent electrode all over the top surface of the array of luminous pillars 10. Although the planarization process can include various methods, the CMP process is suggested as a most effective method in the present invention.

Specifically, in order to make the heights of the luminous pillars 10 and the deposited gap filling material 5 equal to each other, the planarization process is carried out in the present invention. The planarization process is carried out by depositing a thick photo resist (PR) film, and performing a dry etching method in which the oxide film and the PR film are etched at the same speed or the CMP (Chemical Mechanical Polishing) method. Specifically when the CMP is used, since only the oxide film can be selectively etched and the GaN film can be used as a stopper layer of planarization, the controllability and the reproducibility are excellent.

In other words, since GaN is very stable chemically and mechanically, the CMP method of removing the gap filling layer 5 deposited on the top surface of the luminous pillars 10 does not damage the GaN layer. That is, since the array of luminous pillars 10 themselves can be used as the end point layer of planarization, the reproducibility and the reliability of the planarization process can be considerably enhanced.

As a solution used for the CMP process, a general alkaline solution of softening the oxide film is used. A commercialized product of the alkaline solution can be include Syton, in which the softness of oxide film can be controlled by adjusting the acidity (pH) of the alkaline solution. Fine SiO2 or Al2O3 can be used as the polishing particles, and in order to decrease difference in height between the top surface of the luminous pillars and the top surface of the gap filling material after finishing the planarization process, finer particles are more advantageous.

Figure 3:
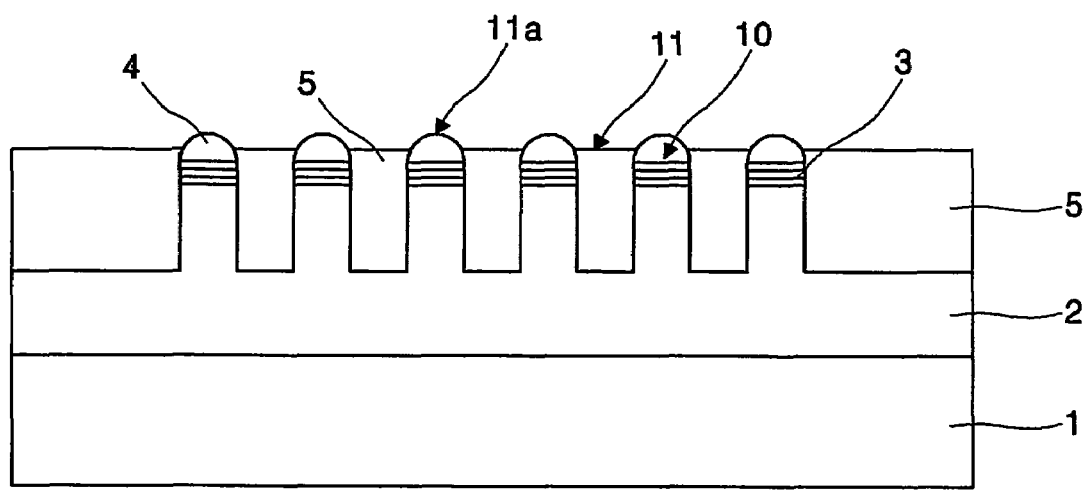
FIGS. 3 and 4 are views illustrating modifications of the micro LED according to one embodiment of the present invention.

In order to conserve the shape of the luminous pillars 10 without any damage as shown in FIG. 2D, it is preferable that a hard polishing pad such as a glass is used and force applied to a sample is small. Further, when the CMP process is carried out with applying a large force to the sample and using a soft polishing pad, the uppermost layer of the GaN layer (the top surface of the p-type GaN layer) can be processed into a lens shape 11a as shown in FIG. 3. This is another advantage of the CMP process, and the lens shape 11a shown in FIG. 3 enhances the luminous efficiency and the straightness of light.

Figure 2E:
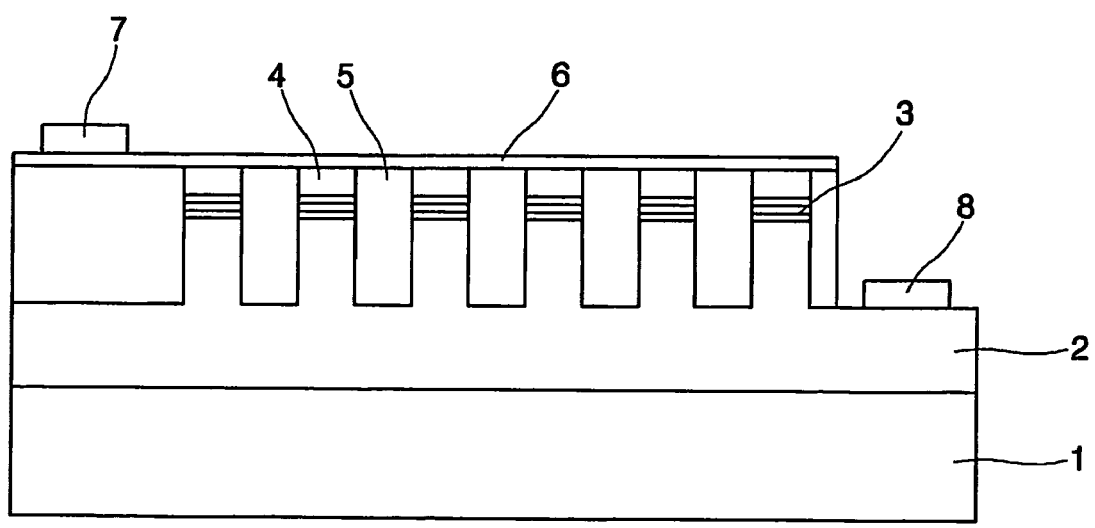

Next, as shown in FIG. 2E, in a final process after the CMP process, the transparent electrode 6 is formed. That is, the transparent electrode 6 is formed in a large area on the p-type GaN which is the top surface of the luminous pillars 10 exposed after finishing the planarization process, thereby forming a structure in which the respective luminous pillars are electrically pumped and all the pillars 10 are driven at the same time. As a material of the transparent electrode 6, a thin Ni/Au or ITO is used. Then, the p-type electrode 7 ad the n-type electrode 8 is formed and then the resultant structure is heated.

Figure 4:
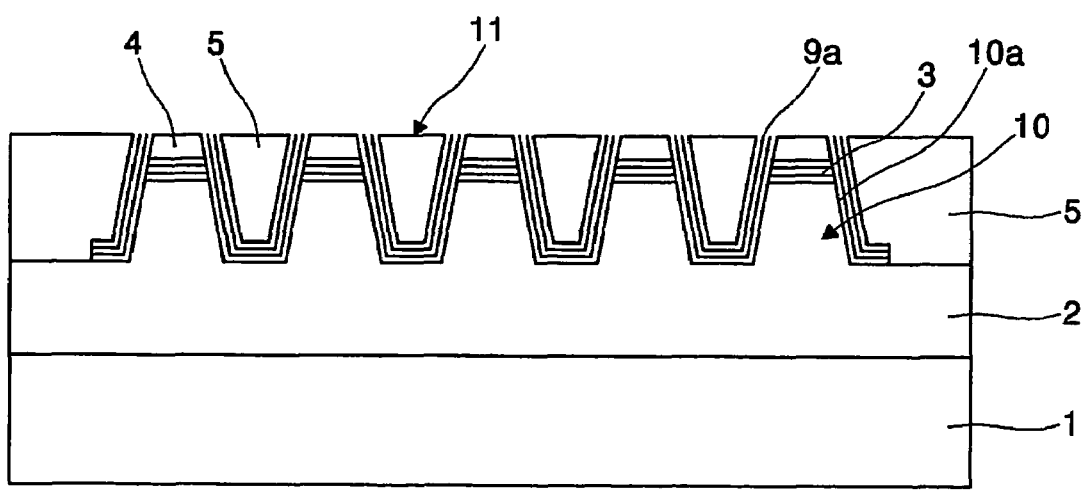

On the other hand, by varying the process variables in the aforementioned ICP etching process, the slope of the side surfaces can be controlled. In general, an etching process without an oblique slope and with an excellent verticality can be preferred, but it may be necessary to form an oblique side surface, depending upon the selection of gap filing material. That is, when the DBR material is selected as the gap filling material, the oblique side surface is more advantageous than the vertical side surface from the point of view of process. For example, by forming the side surfaces of the luminous pillars 10 obliquely and filling the gaps therebetween with the gap filling material of DBR material, the shape shown in FIG. 4 can be obtained. In other words, the DBR layer 9a is first formed in the internal side surfaces 10a and the bottom portion of the gaps 12 using $ZrO_2/SiO_2$ or $HfO_2/SiO_2$, and then the gap filling material comprising other material can be further filled therein. Then, although not shown in FIG. 4, the transparent electrode 6, the p-type electrode 7 and the n-type electrode 8 can be formed as described above.

Furthermore, in the present invention, when the luminous element is used to have a flip-chip structure in which the substrate 1 of the semiconductor element is directed upward, a metal electrode 6a which allows the flip-chip mounting may be deposited in place of the transparent electrode.

Figure 5:
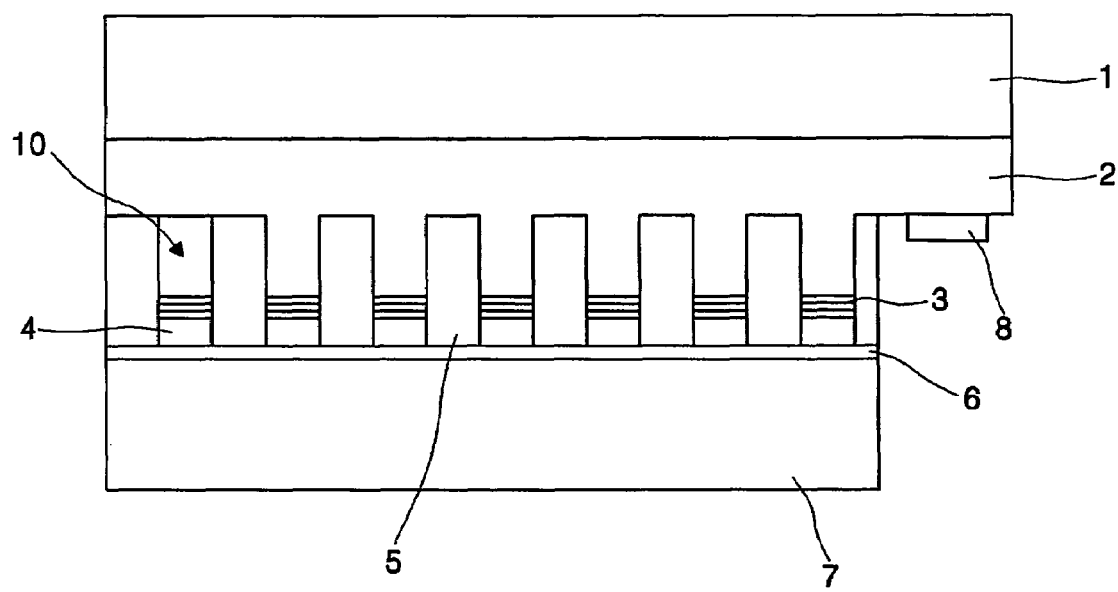
FIG. 5 is a view illustrating another modification of the micro LED according to one embodiment of the present invention.

Although the example described above has a structure in which light is emitted toward a top of element, the present invention is not limited to such structure, but may include a flip-chip structure in which light is emitted toward the substrate. In other words, by manufacturing the element in which the transparent electrode 6 or the metal electrode 6a is provided into the flip-chip structure as shown in FIG. 5, the light emitted toward the substrate 1 can be used with a high efficiency.

Furthermore, the flip-chip structure prevent a local discontinuity of the thin transparent electrode which may be generated due to a fine difference in height of the top surface of the gap filling material (the bottom surface of the gap filling material in FIG. 5) and the luminous pillars 10. That is, the luminous pillars are prevent from not being driven at the same time due to the local discontinuity.

Like this, when the present invention employs the flip-chip structure, the aforementioned problems can be completely solved, thereby obtaining a high light efficiency. In addition, considering that the luminous efficiency is increased with smaller difference of refraction index between the luminous layer and its adjacent medium, the emitted light necessarily passes through the substrate in the flip-chip structure, and thus it is possible to obtain a higher luminous efficiency compared with a structure in which the emitted light is directly discharged in air.

Furthermore, in addition to the final element structure of the aforementioned examples of the present invention, an AR (Anti-reflection) layer may be coated, or the DBR layers may be deposited on the top and bottom surfaces of the element, thereby obtain an RCLED (Resonant Cavity LED) structure. In this case, even if the reflectivity thereof is not as high as the DBR layer formed in the VCSEL (Vertical Cavity surface emitting diode), the DBR layer having a proper reflectivity can enhance re-cyclability of the emitted light and thus is effective for improving quality of the emitted light.

Second Embodiment

FIGS. 6A to 6D are views illustrating a method of manufacturing the micro LED using a selective re-growth method in place of a dry etching method in manufacturing the micro LED in the first embodiment.

The second embodiment employs a selective re-growth method, unlike the first embodiment employing the dry etching method for formation of the luminous pillars 10. In this case, the second embodiment does not require the CMP process.

Figure 6A:
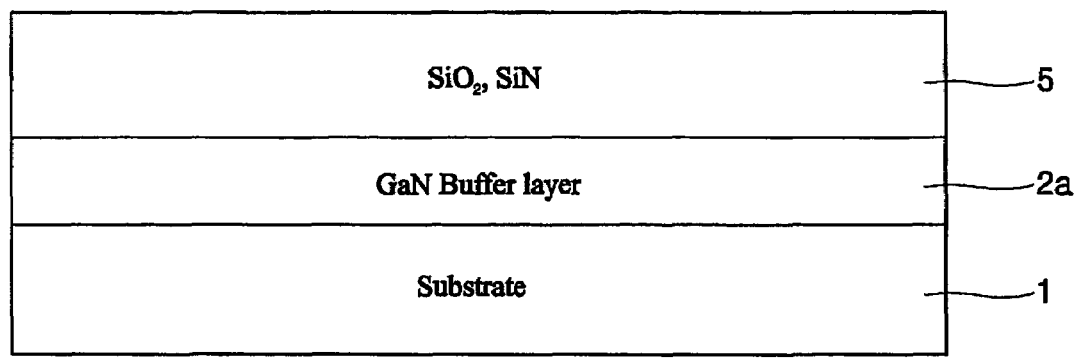
FIGS. 6A to 6D are views illustrating a method of manufacturing the micro LED using a selective re-growth method in place of a dry etching method in manufacturing the micro LED shown in FIG. 1.
Figure 6B:
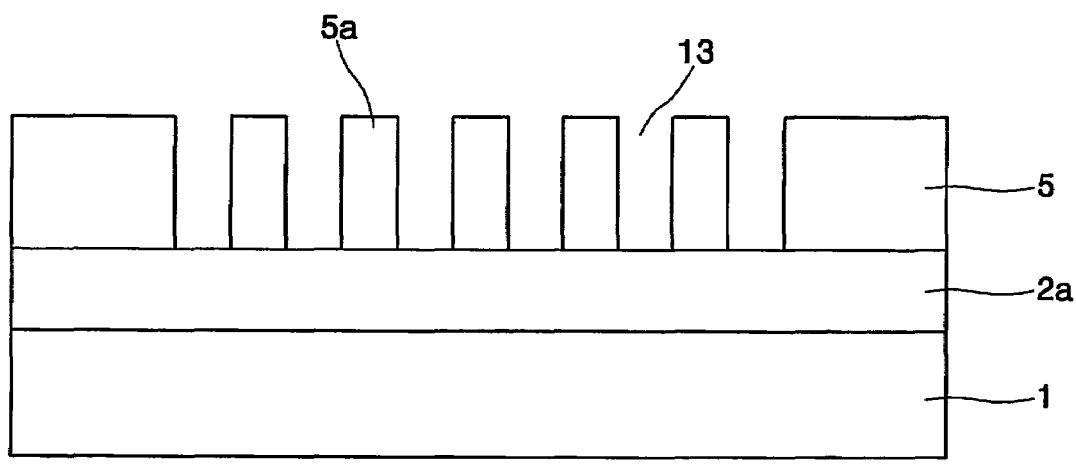
Figure 6C:
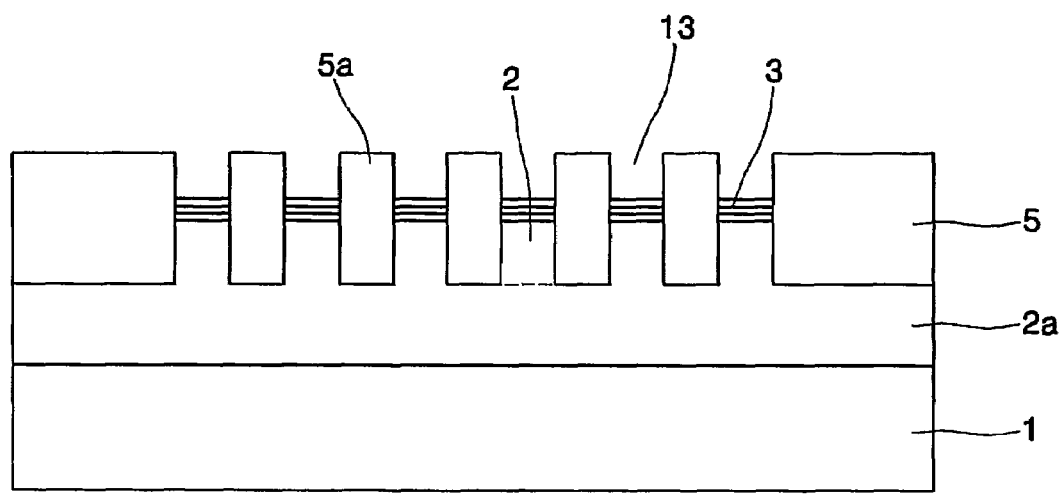
Figure 6D:
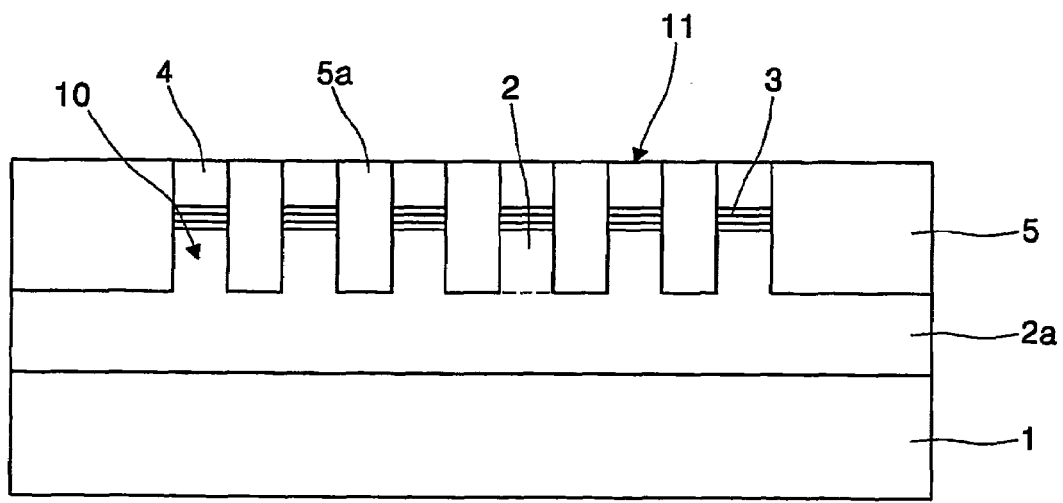

As shown in FIG. 6A, first, a GaN buffer layer 2a for re-growing the luminous pillars 10 (see FIG. 6D) is grown on the substrate 1, and then the oxide film 5 is deposited thereon in a thickness of the luminous pillars desired to obtain. By patterning the oxide film 5 using a wet etching method, the shape shown in Fig. B is obtained, and the re-growth is carried out using the exposed GaN buffer layer 2a (see FIG. 6C). As the re-grown layer, the n-type GaN layer 2, the InGaN/GaN QW active layer 3 and the p-type GaN layer 4 are grown on the n-type GaN buffer layer 2a (see FIG. 6D). As shown in FIG. 6D, it is preferable that the thickness of the re-grown layer constituting the luminous pillars 10 is equal to that of the oxide film. Although not shown in the drawings, the transparent, the p-type electrode and the n-type electrode are finally formed as in the first embodiment, to complete the element.

Of course, in this embodiment, a pair of DBR layers may be formed on the substrate and the uppermost layer of the completed element to form a resonant cavity LED, or the substrate and the uppermost layer may be coated with the AR layer to further enhance the light efficiency.

Although the micro-sized nitride semiconductor LED is described in the above embodiments, the present invention may easily apply to all types of micro-sized light emitting diodes.

What is claimed is:

1. A nitride micro LED (Light Emitting Diode) with high brightness, comprising:
    a plurality of micro-sized luminous pillars having an n-type GaN layer formed on a substrate, and active layer 3 formed on the n-type GaN layer, and a p-type GaN layer formed on the active layer;
    a gap filling material filled between the luminous pillars to have substantially the same height as the luminous pillars, wherein the gap filling material includes at least one selected from $SiO_2$, $Si_3N_4$, or a combination thereof, polyamide, and $ZrO_2/SiO_2$ or $HfO_2/SiO_2$, and wherein the gap filling material is formed to have substantially the same height as the luminous pillars through a CMP (Chemical Mechanical Polishing) process;
    a p-type transparent electrode formed on a top surface of the gap filling material and the luminous pillars;
    a p-type electrode formed on the p-type transparent electrode;
    an n-type electrode electrically connected to the n-type GaN layer, wherein an array of the luminous pillars is driven at the same time; and
    wherein a top surface of the p-type GaN layer of the luminous pillars has convex surfaces formed through the CMP process.

2. A nitride micro LED (Light Emitting Diode) with high brightness, comprising:
    a plurality of micro-sized luminous pillars having an n-type GaN layer formed on a substrate, and active layer 3 formed on the n-type GaN layer, and a p-type GaN layer formed on the active layer;
    a gap filling material filled between the luminous pillars to have substantially the same height as the luminous pillars;
    a p-type transparent electrode formed on a top surface of the gap filling material and the luminous pillars;
    a pair of DBR (Distributed Bragg Reflectors) layers formed on a top surface of the transparent electrode and a bottom surface of the substrate, respectively;
    a p-type electrode formed on the p-type transparent electrode; and
    an n-type electrode electrically connected to the n-type GaN layer, wherein an array of the luminous pillars is driven at the same time.

3. A nitride micro LED (Light Emitting Diode) with high brightness, comprising:
    a plurality of micro-sized luminous pillars having an n-type GaN layer formed on a substrate, and active layer formed on the n-type GaN layer, and a p-type GaN layer formed on the active layer, wherein the luminous pillars have side surfaces that are formed obliquely;
    a gap filling material filled between the luminous pillars to have substantially the same height as the luminous pillars;
    a DBR layer made of $ZrO_2/SiO_2$ or $HfO_2/SiO_2$ and formed below the gap filling material within gaps between the luminous pillars;
    a p-type transparent electrode formed on a top surface of the gap filling material and the luminous pillars;
    a p-type electrode formed on the p-type transparent electrode;
    an n-type electrode electrically connected to the n-type GaN layer, wherein an array of the luminous pillars is driven at the same time.

* * * * *